(12) United States Patent
Trogisch

(10) Patent No.: US 7,965,375 B2
(45) Date of Patent: Jun. 21, 2011

(54) LITHOGRAPHY MASK, REWRITABLE MASK, PROCESS FOR MANUFACTURING A MASK, DEVICE FOR PROCESSING A SUBSTRATE, LITHOGRAPHIC SYSTEM AND A SEMICONDUCTOR DEVICE

(75) Inventor: Sven Trogisch, Dresden (DE)

(73) Assignee: Qimoda AG, München (DE)

( * ) Notice: Subject to any disclaimer, the term of this patent is extended or adjusted under 35 U.S.C. 154(b) by 1007 days.

(21) Appl. No.: 11/773,329

(22) Filed: Jul. 3, 2007

(65) Prior Publication Data

US 2009/0009737 A1      Jan. 8, 2009

(51) Int. Cl.
*G03B 27/42* (2006.01)
*G03F 1/00* (2006.01)
(52) U.S. Cl. ............................................. 355/53; 430/5
(58) Field of Classification Search ............... 355/75, 355/53; 450/5
See application file for complete search history.

(56) References Cited

U.S. PATENT DOCUMENTS

| | | | |
|---|---|---|---|
| 5,453,860 A * | 9/1995 | Akiyama et al. | 349/28 |
| 6,403,475 B1 * | 6/2002 | Tanabe et al. | 438/663 |
| 2001/0003681 A1 * | 6/2001 | Gal-Or et al. | 438/785 |
| 2005/0105180 A1 * | 5/2005 | Mackey | 359/500 |
| 2006/0170898 A1 * | 8/2006 | Finders | 355/69 |
| 2006/0188793 A1 * | 8/2006 | Taravade et al. | 430/5 |
| 2007/0152253 A1 * | 7/2007 | Lee et al. | 257/295 |
| 2007/0242252 A1 * | 10/2007 | Tinnemans | 355/67 |

OTHER PUBLICATIONS

Otto, T., "Local-scale optical properties of single-crystal ferroelectrics," Dissertation, 2006, pp. 1-120, Technische Universität Dresden, Germany.

* cited by examiner

*Primary Examiner* — Peter B Kim
(74) *Attorney, Agent, or Firm* — Cohen Pontani Lieberman & Pavane LLP

(57) ABSTRACT

Lithography mask or rewritable mask comprising at least one material with reversible changeable optical properties. Processes for manufacturing a mask, devices for processing a substrate, lithographic systems and semiconductor devices.

42 Claims, 8 Drawing Sheets

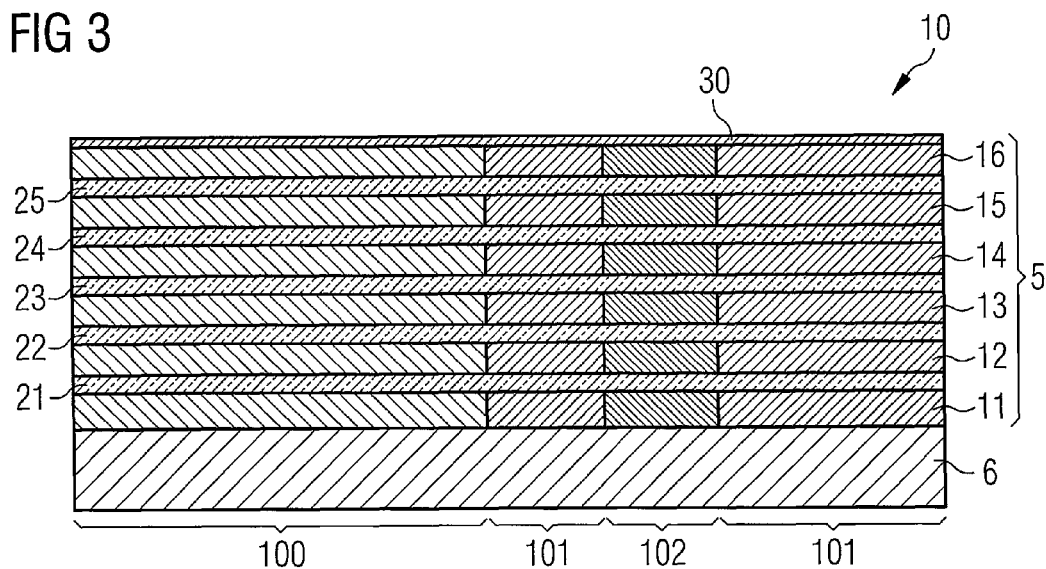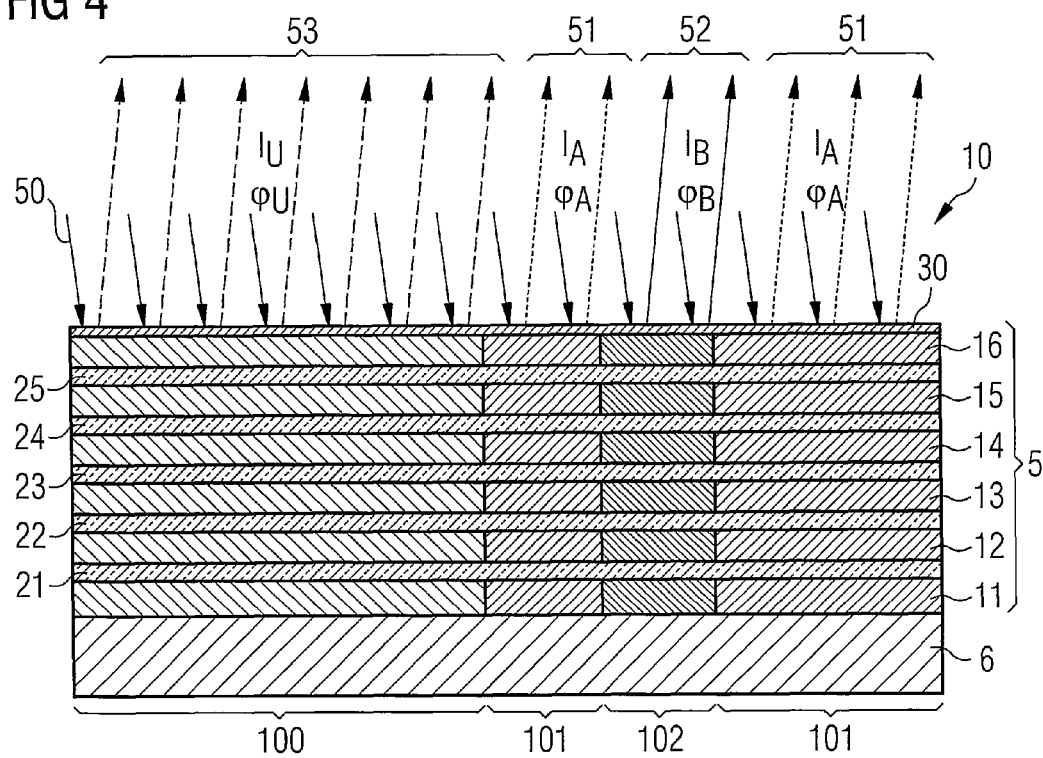

LITHOGRAPHY MASK, REWRITABLE MASK, PROCESS FOR MANUFACTURING A MASK, DEVICE FOR PROCESSING A SUBSTRATE, LITHOGRAPHIC SYSTEM AND A SEMICONDUCTOR DEVICE

BACKGROUND

Masks are used in manufacturing of structures on or in substrates.

BRIEF DESCRIPTION OF THE DRAWINGS

The drawings show different exemplary embodiments and are not to be interpreted to limit the scope of the invention.

FIG. 3 shows the cross section of the embodiment according to FIG. 2 after the ferroelectric material has been altered into ferroelectric domains having different material properties;

FIG. 4 shows schematically the reflective behavior of the mask according to the embodiment shown in FIG. 3;

DETAILED DESCRIPTION OF ILLUSTRATIVE EMBODIMENTS

Figure 1:
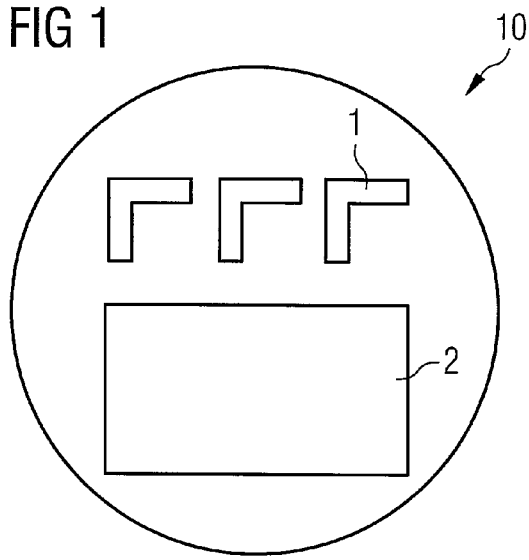
FIG. 1 schematically shows an embodiment of a mask with ferroelectric regions and non-ferroelectric regions.

In lithographic processes masks 10 are used to transfer a mask pattern 1, 2 to a substrate. In the manufacturing of, e.g., semiconductor devices it is known to use transmission masks 10 or reflective masks. Examples for semiconductor devices are microprocessors, integrated circuits, memory chips, DRAM-chips, PCRAM chips, flash chips, microelectromechanical devices or biochips. Concepts of the invention apply to all of the devices, as well as others.

In the following description different embodiments of masks 10, processes and systems used in connection with those masks 10 are described in which the masks 10 comprise at least partially one material with reversible changeable optical properties.

A non limiting example for such a material is a ferroelectric material, though others are possible.

A ferroelectric material exhibits a dipole moment even in the absence of an external electrical field. Ferroelectric materials generally comprise regions called domains within each of which the polarization is in the same direction, but in adjacent domains the polarization is in different directions. When the material is warmed above the Curie Temperature the previous existing polarization state is changed back to a crystal structure having a lower symmetry.

In the embodiments described below at least one material property of the mask 10 is changed (switched) by applying a structuring field 41 (see FIG. 2) at least once to the at least one ferroelectric material. Here, a structuring field 41 can be an electrical field, a magnetic field or a combined electro-magnetic field.

Material properties of the ferroelectric domain are used to define, e.g., the transmissive or reflective properties of the mask 10. Possible material properties are the diffraction index, the absorption, the dielectric constant and/or the optical path lengths. With these (and other properties) the lithographic properties of the mask 10 can be selectively altered by an external structuring field 41. The optical properties of the mask 10 depend on the ferroelectric state of the ferroelectric domains 101, 102, (see FIG. 3) so that the pattern printed on a substrate depends on the ferroelectric state of domains 101, 102 in the mask 10.

In an embodiment, here shown in FIG. 1, only parts of the mask 10 pattern are defined using ferroelectric domains. Referring to the cross-section of figures, the first pattern 1 comprises ferroelectric domains 101, 102. The second pattern 2 comprises non-ferroelectric material, i.e., the patterning is done using other types of materials (see below for further embodiments). This allows certain regions of the mask 10 to be patterned in the known way, i.e., by use of absorber structures and usual multilayer mirrors in the case for EUV reflective masks. This would result in a combined non-ferroelectric and ferroelectric mask 10. In an alternative embodiment all patterns on the mask 10 comprise ferroelectric material.

If the structuring field 41 is applied more than once to the mask 10, the material properties of the ferroelectric domains 101, 102 can be rewritten by the application of a structuring field 41 in the same or in a different way. It is possible to reset the ferroelectric state to a base state, before rewriting the ferroelectric domains 101, 102.

In a further embodiment the whole area of the mask 10 is rewritable, i.e., comprises ferroelectric domains 101, 102 that can be altered by the structuring field 41.

In either way, it is possible to provide a rewritable lithography mask 10 using ferroelectric material.

In principle all materials exhibiting ferroelectric properties, e.g. having adaptable optical properties can be used. The following examples are examples of different embodiments of ferroelectric materials, i.e., the examples do not limit the scope of the invention. In one embodiment the ferroelectric materials are solids at room temperature.

Non-hydrated materials having ferroelectric properties are, e.g.:

Perovskites such as, e.g., $BaTiO_3$,
$LiNbO_3$ types such as, e.g., $LiTaO_3$,
Manganites such as, e.g., $YMnO_3$,
Tungsten bronze types such as, e.g., $PbNb_2O_6$,
Pyrochlore types, such as, e.g., $Cd_2Nb$,
Layer structure oxides, such as, e.g., $Bi_4Ti_3O_{12}$,
Molybdates such as, e.g., $Gd_2(MoO_4)_{32}O_7$,
Vanadates such as, e.g., $Ca_3(VO_4)_2$,
Double oxides such as, e.g., $SbNbO_4$,
$K_2SO_4$ types, such as, e.g., $K_2SeO_4$,
Langbeinites, such as, e.g., $(NH_4)_2Cd_2(SO_4)_3$,
Sulfates such as, e.g., $(NH_4)_2SO_4$,
Selenites such as, e.g., $LiH_3(SeO_3)_2$,
Nitrites such as, e.g., $NaNO_2$,
Nitrates such as, e.g., $KNO_3$
Thiophosphates such as, e.g., $Sn_2P_2S_6$,
Potassium dihydrogen phosphate (KDP) types such as, e.g., $KH_2PO_4$
Barium fluoride types such as, e.g., $BaMnF_4$ Antimony sulfide iodine such as, e.g., SbSBr
Oxyfluorides such as, e.g., $Rb_3MoO_3F_3$,
Boracites such as, e.g., $Mg_3B_7O_{13}Cl$,
Iodates such as, e.g., $NH_4IO_3$
Oxyiodates such as, e.g., $Sb_5O_7I$ Possible ferroelectric materials comprise perovskites. The basic chemical formula for an oxide perovskite follows the pattern $ABO_n$, where A and B are cations of different sizes and the combined charge of A and $\overline{B \text{ can } b}$e e.g. 6.

Examples can be formulated as $ABX_n$ with A=Li, Na, K, Ca, Cu, Sr, Y, Ba, Pb, or rare earth elements B=Al, Sc, Ti, V, Cr, Mn, Fe, Co, Ga, Zr, Nb, Tc, Sn, I, Ce, Hf, Ta, W

X=F, O n>2, especially 3.

Examples for perovskites in particular are $BaTiO_3$, $Sr_n$-$BamTi_fO_k$, $SrTiO_3$, $CaZrO_3$, $CuSnO_3$, $YAlO_3$, $LaAlO_3$, $LaGaO_3$, $NaNbO_3$, $NaWO_3$ and $KIO_3$.

But ferroelectric materials are not limited to these non-hydrated examples.

An example for a hydrated inorganic material are colemanites such as, e.g., $Ca_2B_6O_{11}$ $5H_2O$.

Among non-hydrated organic materials exhibiting ferroelectric properties are triglycine sulfates (TGS) such as, e.g., $(CH_2NH_2COOH)_3H_2SO_4$.

Furthermore, hydrated organic ferroelectric material such as, e.g., triglycine sulfate (TGS) $(CH_2NH_2COOH)_2MnCl_2$ $2H_2O$ can be used.

Furthermore, organic ferroelectric materials such as, e.g, Thiourea $SC(NH_2)$, Tanane $C_9H_{18}NO$ or Benzil $C_{14}H_{10}O_2$ can be used.

Embodiments in which the ferroelectric materials show a change in diffraction index under a structuring field change while having a small absorption can be used.

The size of the structures printable with the lithography masks having at least one ferroelectric domain depends on the minimal size of the ferroelectric domain.

Figure 2:
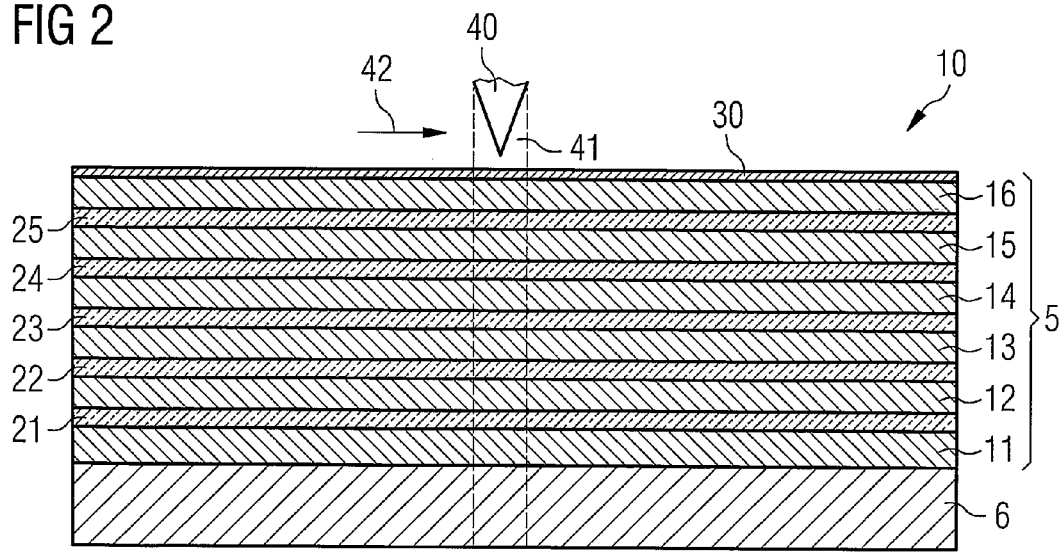
FIG. 2 shows a cross section through an embodiment of a mask comprising layers with ferroelectric material.

In FIG. 2 a cross section through a part of a mask with ferroelectric domains is shown before the ferroelectric domains are structured. The shown embodiment is a reflective mask used, e.g., for short wavelengths, e.g., 13 nm (e.g., EUV) in a lithography system. The person skilled in the art will recognize that the lithography wavelength might differ from the one given here; the wavelength might be shorter or longer.

The mask 10 comprises a multilayer 5 of a plurality of layers 11, 12, 13, 14, 15, 16 comprising ferroelectric material. The multilayer 5 is positioned on a substrate 6. The layers 11, 12, 13, 14, 15, 16 are separated from each other by separation layers 21, 22, 23, 24, 25. On top of the stack a capping layer 30 is positioned. A substrate of mask can comprise at least one of the groups of glass, quartz glass and LTEM (low thermal expansion material).

In FIG. 2 the mask 10 comprising ferroelectric material is shown while it is processed to alter material properties of the ferroelectric material, here optical properties of the ferroelectric layers 11, 12, 13, 14, 15, 16 to achieve a mask pattern to be used in a lithographic process.

In the depicted embodiment a probe 40 is part of a means for producing an structuring field 41 extending vertically into the multilayer 5. If an electrical field 41 is applied as structuring field, the probe comprises an electrode means. If a magnetic field 41 is applied as structuring field, the probe 40 comprises magnetic means.

Since the ferroelectric material in the layers 11, 12, 13, 14, 15, 16 is susceptible to the structuring field 41, the state of the ferroelectric material can be altered locally in a specified way. The probe 40 is one possible embodiment of a means for altering material property, here the optical property of the mask 10.

In the embodiment depicted in FIG. 2, the probe 40 is moved (arrow 42) over the surface of the mask 10. In other embodiments, the mask can be moved relative to the probe 40. In yet other embodiments, both the probe 40 and the mask 10 are moved.

The shape of the probe 40 in FIG. 2 is just an example. Any shape capable of generating a structuring field 41 for altering the ferroelectric state of the ferroelectric material is possible.

By switching the structuring field 41 on and off (or by altering the strength and/or direction of the structuring field 41), the ferroelectric state of the ferroelectric material in the layers 11, 12, 13, 14, 15, 16 can be altered selectively in different regions of the mask 10.

FIG. 3 shows the state of the stack after the processing using the field means probe 40 described in connection with FIG. 2.

In FIG. 3 two first ferroelectric domains 101 with an orientation A are on both sides of a second ferroelectric domain 102 with an orientation B. The domains 101, 102 extent vertically into the multilayer 5. The orientation and/or shape of the domains 101, 102 depend on the structuring field 41.

Another part 100 of the mask 10 remains unaltered. In effect the structuring field 41 modified the ferroelectric state of different regions of the mask 10 which as a result shows a different reflective behavior. This is shown in FIG. 4.

FIG. 4 shows an embodiment with incoming light 50 falling onto the mask 10. Depending on the reflective properties caused by the different ferroelectric properties, the light 50 is reflected in three different ways.

In the region in which the ferroelectric domain 101 has the orientation A the reflected light 51 has the intensity $I_A$ and the phase $\phi_A$.

In the region in which the ferroelectric domain 102 has the orientation B the reflected light 52 has the intensity $I_B$ and the phase $\phi_B$.

The region 100 in which the ferroelectric material has no particular orientation, the reflected light 53 has the intensity $I_u$ and the phase $\phi_U$.

Since the intensities $I_A, I_B$ and $I_u$ are generally not identical and the phases $\phi_A, \phi_B$ and $\phi_U$ are generally not identical, the ferroelectric domains 101, 102 can create a virtual pattern on the mask 10 which can be printed in a lithographic process, e.g. onto a wafer used in semiconductor processing.

The alteration of the ferroelectric states of ferroelectric material in a mask has been shown in an example for a reflective mask having two different ferroelectric orientations. The ferroelectric material in the layer 11, 12, 13, 14, 15, 16 is assumed to be identical in this embodiment.

Other embodiments of the invention use different ferroelectric materials in at least two of the layers of a multilayer 5 structure. Since the different ferroelectric materials react differently to the structuring field 41, more complex reflection patterns can be generated in the mask 10.

The mask 10 shown in the embodiments is a reflective mask. The person skilled in the art will recognize that the same principles apply to a transmission masks which can, e.g., be used for longer wavelengths.

Figure 5:
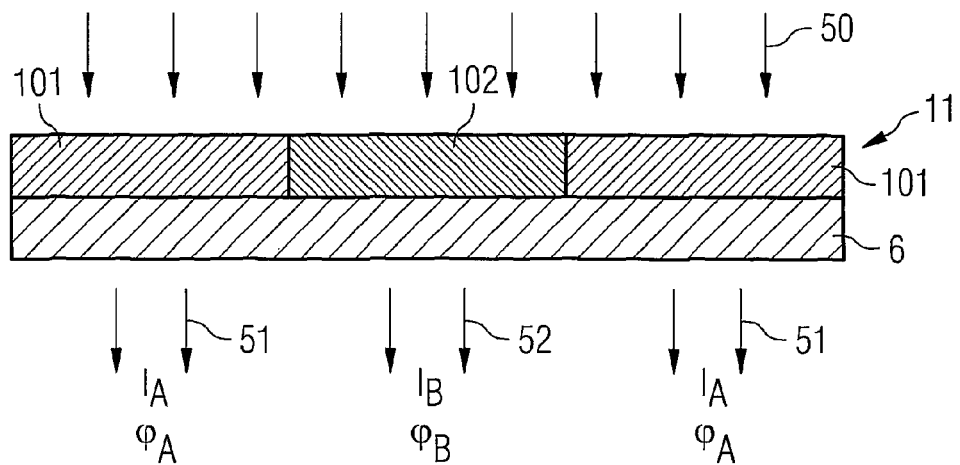
FIG. 5 shows schematically a cross section through an embodiment with a transmission mask.

In FIG. 5 a mask having a substrate 6 with one layer 11 comprising ferroelectric material is shown. The optical property, here the transmissivity can be altered by a probe 40 like the one shown in FIG. 3. The result of the application of a structuring field 41 is a first ferroelectric domain 101 with an orientation A and a second ferroelectric domain 102 with an orientation B. The incoming light 50 is transmitted through the first ferroelectric domain 101 and the second ferroelectric domain 102. The respective transmitted light 51, 52 have different intensities $I_A$, $I_B$ and different phases $\phi_A$, $\phi_B$ which can be exploited in subsequent lithographic process steps.

As shown in FIG. 1, the embodiment of the transmission mask 10 can comprise ferroelectric regions and non-ferroelectric regions.

Figure 6A:
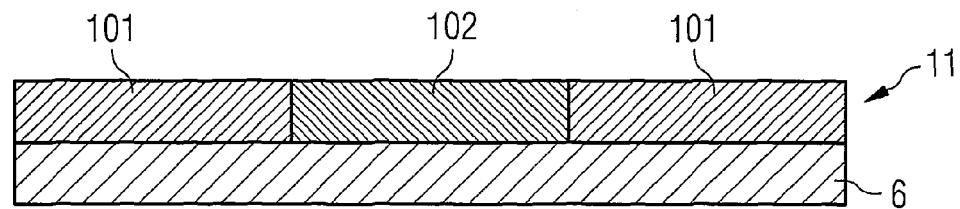
FIGS. 6A-6C show schematically the rewriting of an embodiment of the mask.
Figure 6B:
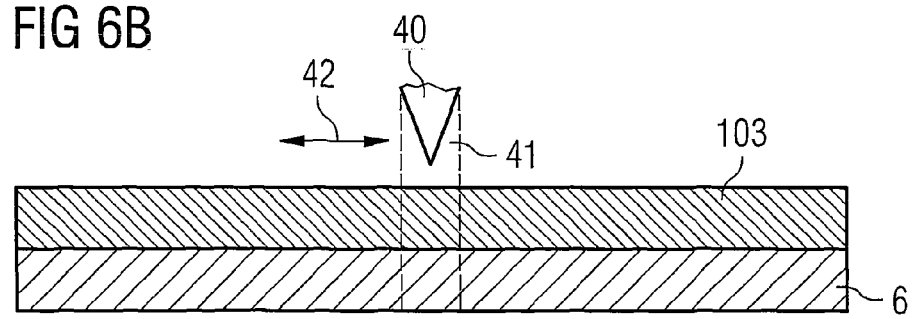
Figure 6C:
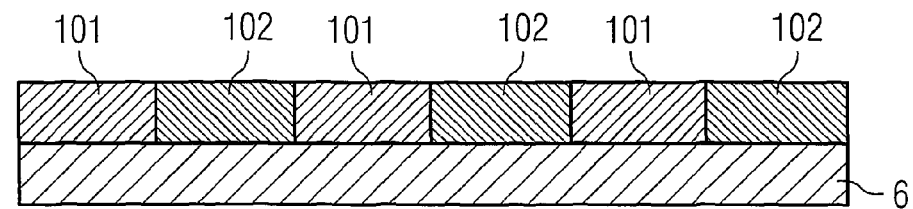

In FIGS. 6A to 6C the rewriting process of a mask 10 is shown schematically. The embodiment refers to a reflective mask 10, but the same principle applies to a transmissive mask 10 as well. In FIG. 6A a cross section through a mask 10 with different ferroelectric domains 101, 102 is shown. The domains 101, 102 are, e.g., configured like the one shown in FIG. 3.

The constituting pattern of the domains 101, 102 is then erased by heating the mask 10 in parts or completely above the Curie Temperature and/or by applying a suitable structuring field 41 in parts or completely to the mask.

The result is a layer 103 comprising ferroelectric material without a specified domain structure (see FIG. 6B). This situation is technically a mask blank without a pattern.

In FIG. 6B it is shown that the layer 103 is subjected to a structuring field 41 from a probe 40 being part of the field means for altering the ferroelectric state of the ferroelectric material.

The structuring field 41 forms a new pattern in the ferroelectric layer 103 by altering the shape, dimension or other property of regions of the ferroelectric material. Or the structuring field 41 forms a new pattern in the in the ferroelectric layer 103 creating definite domains with definite states of polarization within.

In FIG. 6C the altered ferroelectric domains 101, 102 are smaller than the one in FIG. 6A. The person skilled in the art will recognize that this shaping is just an example of the possible alternatives. It might not be necessary to rewrite the entire mask 10, i.e., only a part of the mask is rewritten, while retaining the original pattern within all the other parts.

In effect the ferroelectric layer 103 has become at least in parts a new mask. The mask rewriting process shown here in FIGS. 6A to 6C can be repeated as many times as it is required.

In FIGS. 6A to 6C the rewriting of the mask is shown in an embodiment in which the ferroelectric layer 11 is changed into a blank status (see FIG. 6B) before it is rewritten (see FIG. 6C).

Figure 7A:
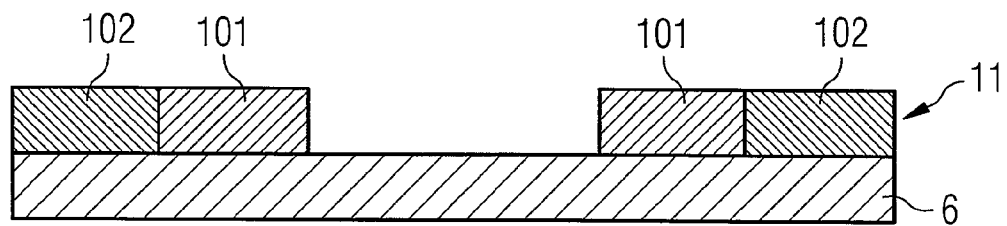
FIGS. 7A-7C show schematically the rewriting of a transmissive mask in a further embodiment.
Figure 7B:
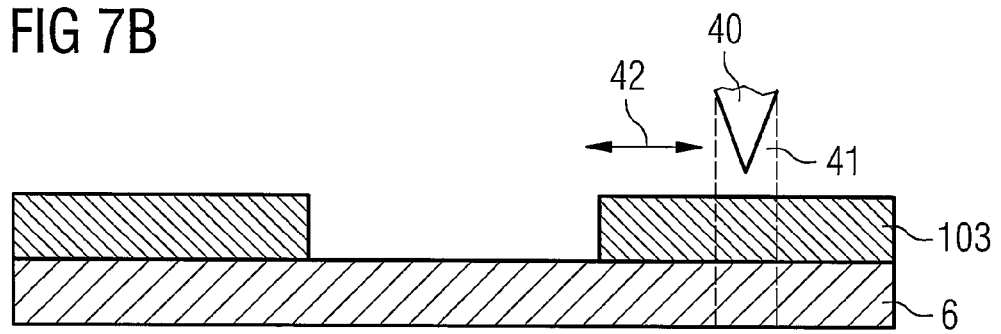
Figure 7C:
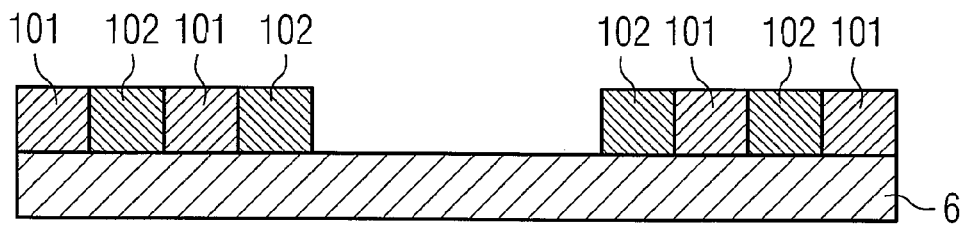

In a variation of the embodiment shown in FIGS. 6A to 6C, depicted here in FIGS. 7A to 7C, the transmissive mask 10 comprises a portion which is completely transmissive. The optical properties of the ferroelectric domains 101, 102 are altered, as in the example described in FIGS. 6A to 6C so that reference to the respective description is made.

Figure 8A:
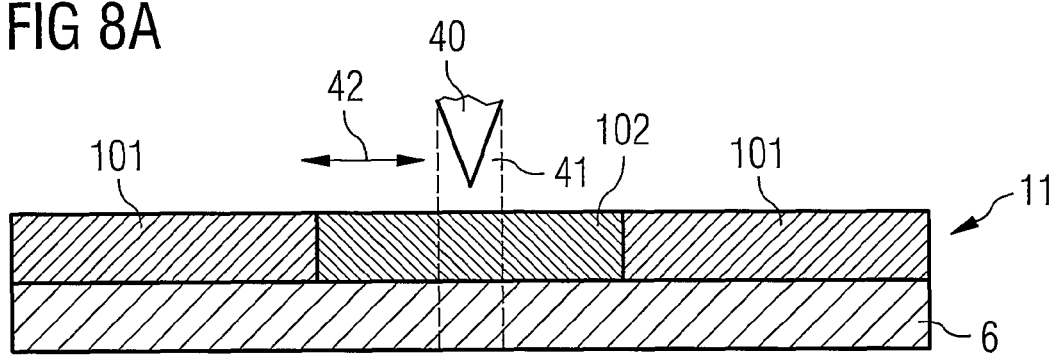
FIGS. 8A, 8B show schematically the rewriting of a transmissive mask in another embodiment.
Figure 8B:
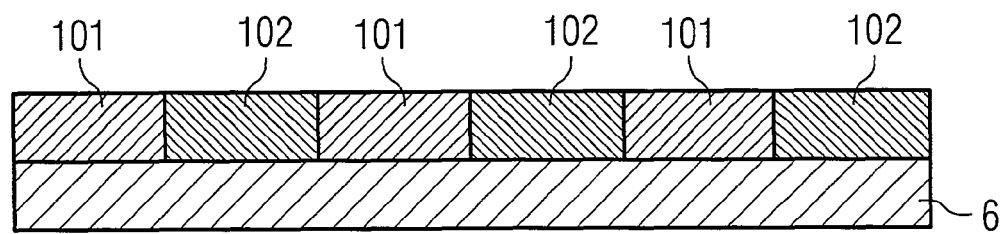

In another embodiment, depicted in FIGS. 8A and 8B, the ferroelectric material in the layer 11 is rewritten directly. In FIG. 8A a first set of ferroelectric domains 101, 102 is present, which is subjected to the structuring field 41. After that the situation shown in FIG. 8B is reached, i.e., a new, finer structuring of the ferroelectric domains 101, 102 is obtained. As in the embodiments described above the rewriting of the masks can be repeated.

Obtaining finer structures is just one example of the possibilities in rewriting masks using ferroelectric material.

Figure 9A:
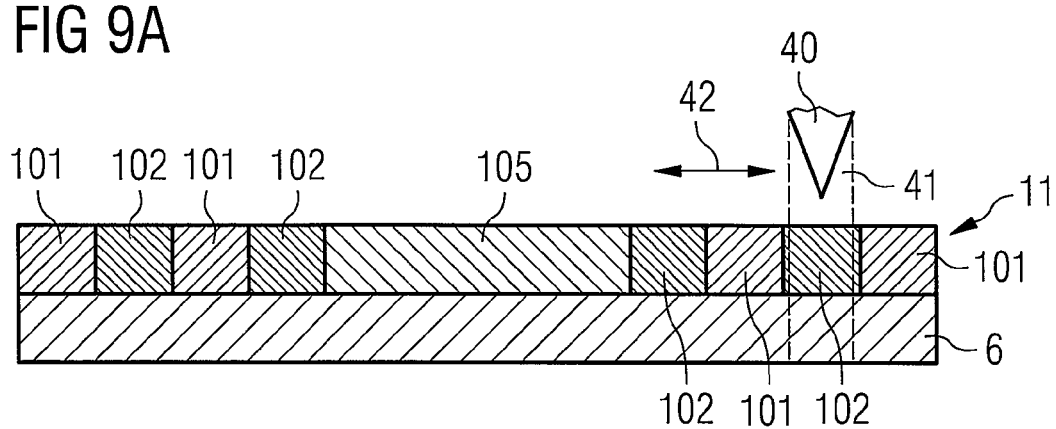
FIGS. 9A, 9B show schematically the partial rewriting of a mask using ferroelectric material and non-ferroelectric material.

In FIG. 9A a cross-section through a part of a transmissive mask 10 is shown for another embodiment. The substrate 6 can be a quartz substrate on which a chrome structure 105 is positioned. The chrome structure 105 functions as an absorber material for the illumination in the lithographic process. Here the chrome structure 105 is assumed to be a line segment. The person skilled in the art will recognize that this is just an example for a structure on a mask 10, e.g. more complex structures are possible.

In FIG. 9A it is depicted that the non-ferroelectric structure 105 is augmented by ferroelectric domains 101, 102 to either side of the non-ferroelectric material 105.

By using a structuring field 41 the optical, i.e., the transmission properties of the ferroelectric domains 101, 102, can be altered as described in the other embodiments above.

Figure 9B:
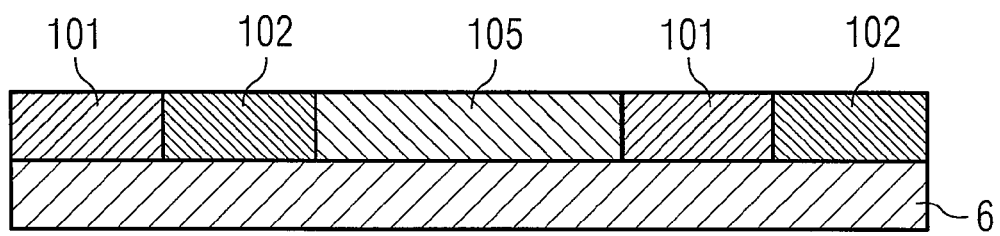

In FIG. 9B the cross section is shown after the application of the structuring field 41. Here the number of ferroelectric domains 101, 102 is reduced.

The person skilled in the art will recognize that using this technique or a similar technique the width, size or shape of a non-ferroelectric structure 105 on the mask 10 can be altered. It is possible that the non-ferroelectric structure 105 provides a backbone for a more permanent mask structure. The ferroelectric domains 101, 102 are used to adapt the complete mask or only portions of the mask to individually chosen structures for one illumination process. After that, the mask pattern can be changed by applying the structuring field 41 to the whole mask or to a portion of it.

One possible application of this adaptation is the flexible manufacturing of phase assist structures next to bigger structures.

Using one of the techniques shown here or a combination of the techniques is the manufacturing of highly individualized semiconductor devices. This is shown in FIGS. 10A and 10B.

With a first mask 10 comprising ferroelectric material a first wafer 200 with a first set of semiconductor devices 201 is manufactured. Here only four semiconductor devices 201 are shown for the sake of simplicity. The person skilled in the art will recognize that the wafer 200 can be a wafer, especially a silicon wafer with a large number of memory chips, microprocessors, optoelectronic devices, biochips or any other possible semiconductor devices.

Figure 10A:
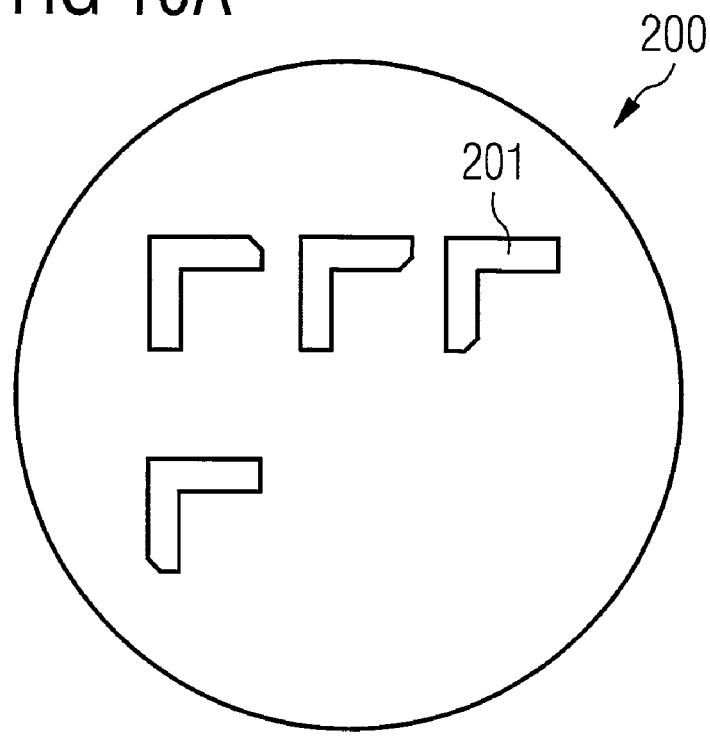
FIGS. 10A, 10B show schematically the manufacturing of semiconductor devices.
Figure 10B:
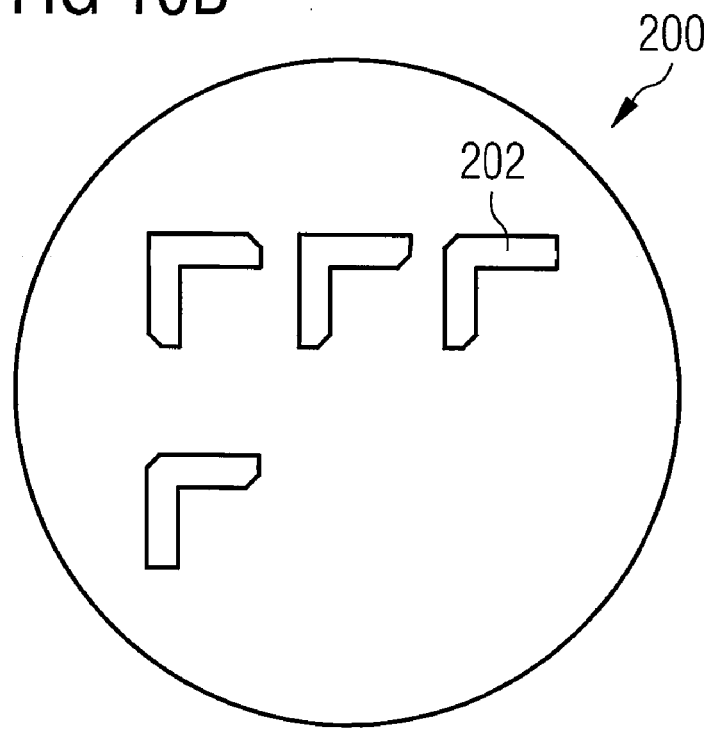

The devices 201 are at least in part different from one another as symbolized by the different shapes in FIG. 10A.

The first mask 10 comprising ferroelectric material is at least in parts subjected to a structuring field 41. Thereby at least a part of the mask pattern is rewritten, as it is, e.g., shown in the previous embodiments. The altered mask is then used to manufacture a different second set 202 of semiconductor devices on new wafer.

In FIG. 10B the shapes of the devices are indicated as being different from the first set.

The person skilled in the art will recognize that the techniques shown in connection with a transmissive mask are applicable to reflective masks as well.

With a control device (e.g., a computer system not shown here) it is possible to alter the masks in a way that individualized semiconductor devices, possibly unique semiconductor devices, are manufactured.

Figure 11A:
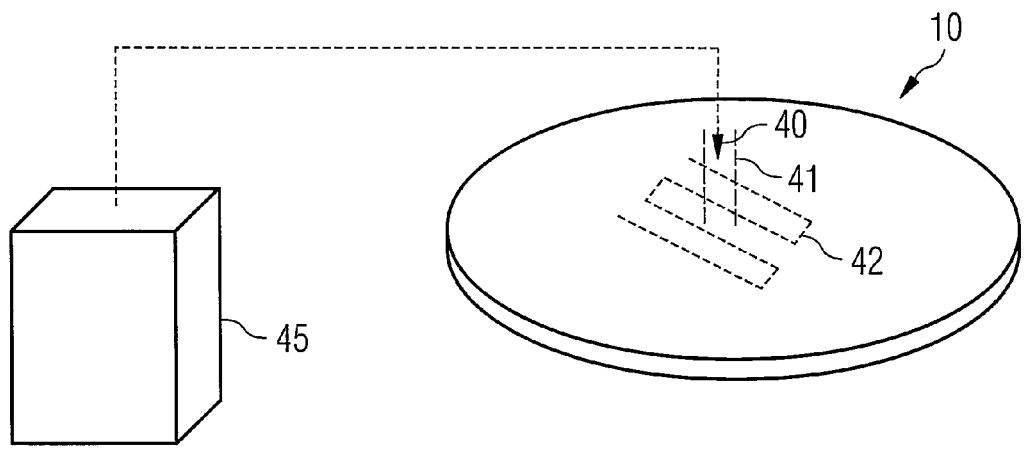
FIGS. 11A, 11B show schematically embodiments of means for altering the ferroelectric properties of a mask.
Figure 11B:
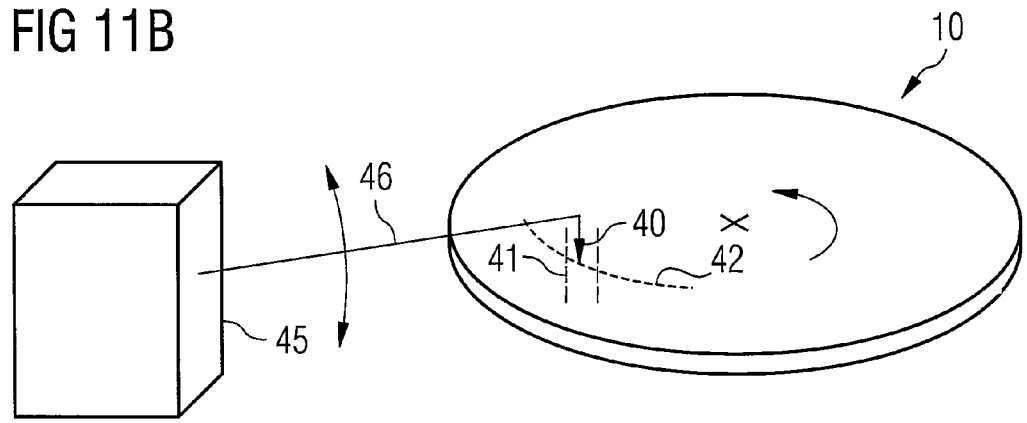

In FIGS. 11A and 11B different embodiments for field means are depicted to illustrate possible ways in using a mask 10 with at least one ferroelectric material.

In FIG. 11A a perspective view of a mask 10 is shown. The individual ferroelectric layers or domains are not shown in FIG. 11 for the sake of simplicity. The internal structure of the mask is, e.g., shown in FIGS. 2, 3, 4 or 5. The mask 10 can be either a transmission mask or a reflective mask.

The field means comprise a generator 45 of a structuring field 41 which is coupled to a probe 40. In the embodiment shown in FIG. 11A the probe 40 is moved in linear paths 42 over the surface of the mask 10. Obviously the path can be generated by initiating any relative movement between the probe 40 and the mask 10.

The generator 45 alters the strength, the on/off status and/or the direction of the structuring field 41 to alter the ferroelectric state of the ferroelectric material. The embodiment shown in FIG. 11A uses a probe 40 for the sake of simplicity. More than one probe 40 can be used to cover more locations of the surface of the mask 10 simultaneously.

In FIG. 11B another embodiment for writing or rewriting the mask 10 is shown. Here the mask 10 is rotated in the direction of the arrow. The probe 40 is connected to the generator with an arm 46 like, e.g., a write head of a hard disk drive. By swiveling the arm 46 with the probe 40, regions all over the mask can be subjected to the structuring field 41.

This way ferroelectric domains 101, 102 (not shown in FIGS. 11A and 11B) of very small dimensions (e.g., in the order of 10 to 100 nm) can be manufactured. Since the patterns on the mask 10 are usually reduced in a lithography process by a lens system, much smaller (e.g., by a factor of 4) patterns can be manufactured on the, e.g., wafer by a lithographic system. But the person skilled in the art will recognize that the ferroelectric domains 101, 102 can also have larger domains.

Even if the movement of the mask 10 is circular, rectangular shapes can be approximated by the addition of short circular segments.

The persons skilled in the art will recognize that the linear or circular movements 41 of the at least one probe 40 can be combined to form complex paths.

The person skilled in the art will recognize that the embodiments described above are just examples and that other parameters of the wavelength, the chosen materials and the chosen application can be selected, depending on the manufacturing process.

What is claimed is:

1. A lithography mask comprising:
   a substrate;
   and a masking material adjacent the substrate, the masking material comprising at least one ferroelectric material, wherein ferroelectric domains are used to generate phase assist structures.

2. The lithography mask according to claim 1, wherein a diffraction index, absorption, dielectric constant or optical path length depends on a ferroelectric domain in the ferroelectric material.

3. The lithography mask according to claim 1, wherein the at least one ferroelectric material comprises a perovskite.

4. The lithography mask according to claim 1, wherein the at least one ferroelectric material comprises at least $ABX_n$;
   wherein A comprises a material selected from the group consisting of Li, Na, K, Ca, Cu, Sr, Y, Ba, Pb, and rare earth elements;
   wherein B comprises a material selected from the group consisting of Al, Sc, Ti, V, Cr, Mn, Fe, Co, Ga, Zr, Nb, Tc, Sn, I, Ce, Hf, Ta, and W;
   wherein X comprises a material selected from the group consisting of O and F; and
   wherein $n>2$.

5. The lithography mask according to claim 1, wherein the at least one ferroelectric material comprises at least a first ferroelectric domain and a second ferroelectric domain, the first and the second ferroelectric domain having reversible different material properties.

6. The lithography mask according to claim 1, wherein the at least one ferroelectric material can be coupled to a field to alter at least one material property of the ferroelectric property.

7. The lithography mask according to claim 6, wherein the at least one material property comprises an optical property of the region of the at least one ferroelectric domain.

8. The lithography mask according to claim 7, wherein the field comprises an external electrical field, a magnetic field or a combined electric-magnetic field.

9. The lithography mask according to claim 7, wherein the alteration of the at least one optical property of the at least one ferroelectric material is reversible at least one time.

10. The lithography mask according to claim 7, wherein the optical property comprises reflectivity or transmissivity.

11. The lithography mask according to claim 7, wherein the optical property comprises constructive interference or destructive interference.

12. The lithography mask according to claim 1, wherein a plurality of ferroelectric domains are positioned at least in part in a circular pattern or a linear pattern on or in the substrate.

13. The lithography mask according to claim 1, wherein the masking material comprises a plurality of ferroelectric materials in a multilayer stack in or on the substrate.

14. The lithography mask according to claim 13, wherein two layers of ferroelectric material are separated by at least one separation layer.

15. The lithography mask according to claim 1, wherein the mask comprises at least one region that is non-ferroelectric.

16. The lithography mask according to claim 15, wherein at least one region comprises a multilayer mirror structure.

17. The lithography mask according to claim 1, wherein the mask is at least in parts transmissive.

18. The lithography mask according to claim 1, wherein the mask is at least in parts reflective.

19. The lithography mask according to claim 1 which is coupled to lithographic system for the manufacturing of semiconductor devices.

20. A method of making a semiconductor device, the method comprising:
    irradiating a semiconductor substrate via a rewriteable mask, the rewriteable mask including at least one ferroelectric material, wherein ferroelectric domains are used to generate phase assist structures; and
    changing a surface of the semiconductor substrate based on the irradiating.

21. The method according to claim 20, further comprising using a field to alter at least one optical property of a region of the ferroelectric material.

22. The method according to claim 20, wherein the ferroelectric material comprises a perovskite.

23. The method according to claim 20, wherein the ferroelectric material comprises $ABX_n$;
    wherein A comprises a material selected from the group consisting of Li, Na, K, Ca, Cu, Sr, Y, Ba, Pb, and rare earth elements;
    wherein B comprises a material selected from the group consisting of Al, Sc, Ti, V, Cr, Mn, Fe, Co, Ga, Zr, Nb, Tc, Sn, I, Ce, Hf, Ta, and W;
    wherein X comprises a material selected from the group consisting of O and F; and
    wherein $n>2$.

24. The method according to claim 20, wherein changing the surface comprises performing a step in the manufacturing of a microprocessor, a memory chip, a DRAM-chip, a PCRAM chip, a flash chip, a microelectromechanical device or a biochip.

25. A method for manufacturing a mask, the method comprising:
provide a substrate; and
depositing at least one region or layer of a ferroelectric material on the substrate, wherein ferroelectric domains are used to generate phase assist structures.

26. The method according to claim 25, wherein the substrate comprises glass, quartz glass or LTEM.

27. The method according to claim 25, wherein depositing the ferroelectric material takes place under the influence of a structuring field.

28. The method according to claim 27, wherein the structuring field is an electrical field, a magnetic field or a combined electric-magnetic field.

29. The method according to claim 25, wherein the ferroelectric material is disposed in a region of the mask subjected to a local structuring field by at least one probe.

30. The method according to claim 29, wherein the ferroelectric material is disposed in a region of the mask subjected to a local structuring field by an electric probe or a magnetic probe.

31. The method according to claim 25, further comprising moving an electrode adjacent the ferroelectric material to selectively alter the ferroelectric state of the material.

32. The method according to claim 31, wherein the electrode is moved at least in parts in circles over the substrate to alter the ferroelectric state of regions on the substrate.

33. The method according to claim 25, further comprising reorienting a ferroelectric state of the mask by a structuring field at least locally.

34. The method according to claim 25, further comprising resetting a ferroelectric state at least in parts to a basic orientation and then reorienting the ferroelectric state by a structuring field.

35. The method according to claim 34, wherein resetting the ferroelectric state comprises applying heat and applying a structuring field.

36. The method according to claim 35, wherein the structuring field is applied at least twice to the ferroelectric material.

37. The method according to claim 25, wherein a first set of mask patterns for manufacturing a first set of at least partially individualized patterns on a substrate is subjected at least partially to a structuring field so that a second set of mask patterns for manufacturing a second set of at least partially individualized patterns on a substrate is produced.

38. A lithographic system for the manufacturing of semiconductor devices, the lithographic system comprising:
an illumination source;
a stage for supporting a semiconductor device; and
a lithography mask disposed between the radiation source and the stage, the mask comprising at least one ferroelectric material, wherein ferroelectric domains are used to generate phase assist structures.

39. The lithographic system according to claim 38, wherein the illumination source has a wavelength of 193 nm or shorter.

40. The lithographic system according to claim 38, further comprising a field means for altering at least one optical property of the lithography mask.

41. The lithographic system according to claim 40, wherein the field means comprises a field means for altering at least one ferroelectric domain of the lithography mask.

42. The lithographic system according to claim 41, wherein the field means comprises at least one electrode for producing a structuring field.

* * * * *

UNITED STATES PATENT AND TRADEMARK OFFICE
CERTIFICATE OF CORRECTION

| | |
|---|---|
| PATENT NO. | : 7,965,375 B2 |
| APPLICATION NO. | : 11/773329 |
| DATED | : June 21, 2011 |
| INVENTOR(S) | : Sven Trogish |

Page 1 of 1

It is certified that error appears in the above-identified patent and that said Letters Patent is hereby corrected as shown below:

Title Page, Item (73) should read -
--(73) ~~Qimoda~~ Qimonda AG,     München (DE)--

Signed and Sealed this
Seventh Day of February, 2012

David J. Kappos
*Director of the United States Patent and Trademark Office*